(12) United States Patent  
Price

(10) Patent No.: US 6,680,871 B1
(45) Date of Patent: Jan. 20, 2004

(54) METHOD AND APPARATUS FOR TESTING MEMORY EMBEDDED IN MASK-PROGRAMMABLE LOGIC DEVICE

(75) Inventor: Richard Price, San Jose, CA (US)

(73) Assignee: Altera Corporation, San Jose, CA (US)

( * ) Notice: Subject to any disclaimer, the term of this patent is extended or adjusted under 35 U.S.C. 154(b) by 84 days.

(21) Appl. No.: 10/112,803

(22) Filed: Mar. 29, 2002

(51) Int. Cl.$^7$ ................................................ G11C 7/00
(52) U.S. Cl. ............. 365/201; 365/189.02; 365/230.03; 365/233; 326/38; 326/40; 326/41
(58) Field of Search ............................ 365/201, 189.02, 365/230.03, 233; 326/38, 40, 41

(56) References Cited

U.S. PATENT DOCUMENTS

| | | | |
|---|---|---|---|
| 5,068,603 A | 11/1991 | Mahoney | 324/158 R |
| 5,212,652 A | 5/1993 | Agrawal et al. | 364/489 |
| 5,815,405 A | 9/1998 | Baxter | 364/489 |
| 6,177,844 B1 | 1/2001 | Sung et al. | 331/25 |
| 6,311,316 B1 | 10/2001 | Huggins et al. | 716/12 |
| 6,486,702 B1 * | 11/2002 | Ngai et al. | 326/40 |
| 6,492,833 B1 * | 12/2002 | Asson et al. | 326/41 |

OTHER PUBLICATIONS

Xilinx, *HardWire Data Book*, "XC3300 Family HardWire Logic Cell Arrays," Preliminary Product Specification, 1991.

Xilinx, *HardWire Data Book*, pp. 1–1 through 2–28, 1994.

\* cited by examiner

*Primary Examiner*—Richard Elms
*Assistant Examiner*—Toan Le
(74) *Attorney, Agent, or Firm*—Fish & Neave; Jeffrey H. Ingerman

(57) ABSTRACT

In a mask-programmable logic device having embedded memory blocks, which device cannot be reconfigured for testing like a full programmable logic device, the embedded memory blocks are tested by forming scan chains from the input-side registers of a plurality of embedded memory blocks, and from the output-side registers of a those embedded memory blocks. Test vectors are clocked into the input-side scan chain and the results are clocked out from the output-side scan chain. The test vectors can be made by concatenating multiple copies of a test vector for one block when the blocks are identical. The method works even where one or more embedded memory blocks are configured as read-only devices, as long as the contents of the read-only devices are known so that one knows what test output to expect.

19 Claims, 4 Drawing Sheets

METHOD AND APPARATUS FOR TESTING MEMORY EMBEDDED IN MASK-PROGRAMMABLE LOGIC DEVICE

BACKGROUND OF THE INVENTION

This invention relates to a mask-programmable logic device having embedded random access memory blocks. More particularly, the invention relates to such a device having circuitry for testing the random access memory blocks, and to a method of testing.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices have been provided. With mask-programmable logic devices, instead of selling all users the same device, the manufacturer manufactures a partial device with a standardized arrangement of logic elements, and which lacks any routing or interconnect resources.

The user provides the manufacturer of the mask-programmable logic device with the specifications of a desired device, which may be the configuration file for programming a comparable programmable logic device. The manufacturer uses that information to add additional metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

Because all but the earliest types of conventional programmable logic devices are reconfigurable as described above, testing of those devices, and particularly of embedded random access memory blocks thereon, is readily accomplished. In particular, after the device is manufactured, and before it is sold to a user, the device can be configured with a test configuration that tests the components of the device in any desired manner. The test configuration can be erased before the device is sold to a user. It is also possible for the user to load its own test configuration, which can then be erased prior to loading of the desired user application configuration.

On the other hand, mask-programmable logic devices cannot be reconfigured. Any test circuitry provided on the device is permanently present, and accordingly providing such circuitry either increases the die size of the device for a given level of functionality, or reduces the functionality for a given die size. It would therefore be desirable to provide a mask-programmable logic device, of the type having embedded random access memory blocks, with testing circuitry, the area (and hence the cost) of which has been minimized, as well as a method for testing such a device.

SUMMARY OF THE INVENTION

It is an object of the present invention to provide a mask-programmable logic device, of the type having embedded random access memory blocks, with testing circuitry, the area (and hence the cost) of which has been minimized, as well as a method for testing such a device.

This and other objects of the invention are accomplished in accordance with the principles of the invention by providing a mask-programmable logic device including an array of mask-programmable logic areas and a plurality of embedded memory blocks. Each of the embedded memory blocks is associated with one of the mask-programmable logic areas. Each of the embedded memory blocks has a set of read/write control registers, write data registers and data output registers associated therewith. The mask-programmable logic device also includes memory testing circuitry having first switching elements for chaining together at least some of the read/write control registers and the write data registers, and second switching elements for chaining together at least some of the data output registers. A test scan clock clocks data through the chains of read/write control registers and write data registers, and the chains of output registers.

By comparing data clocked in through one chain of registers on the input side of the embedded memory block or blocks with data clocked out another chain of registers on the output side of the embedded memory block or blocks, one can determine whether or not the output data are those which is expected based on the input data, which is an indication of whether or not the embedded memory block is functioning correctly.

The embedded memory blocks can be configured for testing before the testing begins, so that regardless of the configuration for which each has been programmed, each will emulate a common configuration during testing. Preferably, each embedded memory block acts as a 128×16 memory array. Where an embedded memory block has been configured as a read-only device—i.e., as a read-only memory or as a P-TERM logic unit—the values in the cells of the embedded memory block will nevertheless be output as though from the common configuration.

BRIEF DESCRIPTION OF THE DRAWINGS

The above and other objects and advantages of the invention will be more apparent upon consideration of the following detailed description, taken in conjunction with the accompanying drawings, in which like reference characters refer to like parts throughout, and in which.

DETAILED DESCRIPTION OF THE INVENTION

Figure 1:
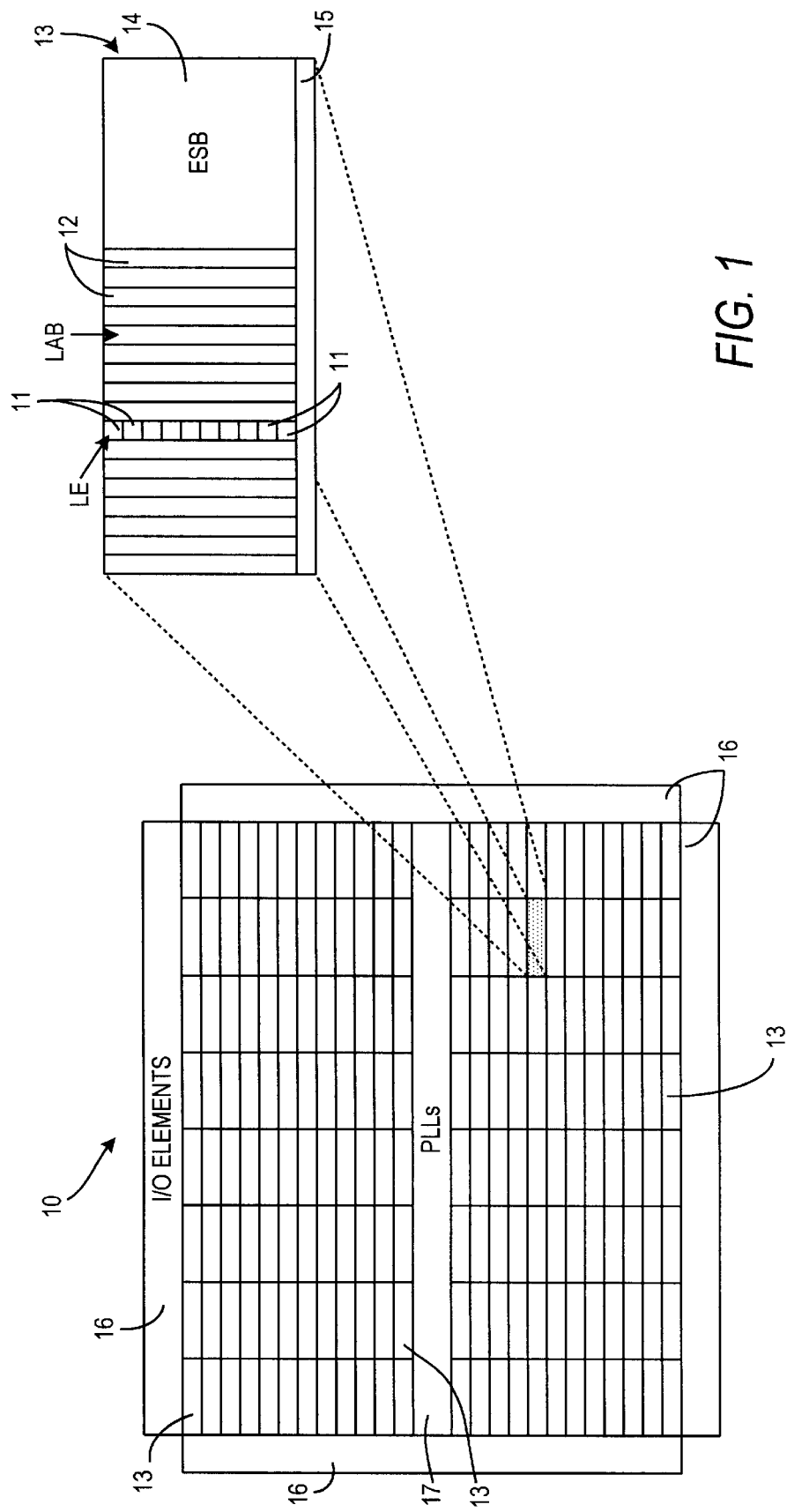
FIG. 1 is a schematic representation of the layout of a preferred embodiment of a mask-programmable logic device in accordance with the present invention.

The present invention allows testing of embedded memory blocks in a mask-programmable logic device, whose resources cannot be reconfigured, using minimal resources of the device. This is accomplished by using scan chains to clock the test vectors to multiple embedded memory blocks from a single input, and to clock out the test outputs for all of those blocks through a single output. At the same time, the embedded memory blocks preferably are designed so that they can be configured identically during testing, regardless of their respective user configurations.

As in conventional programmable logic devices, the logic modules or areas, and therefore their associated embedded memory blocks, of a mask-programmable logic device in accordance with the present invention preferably are arranged in an orthogonal array having columns and rows. While not every logic area has an associated embedded memory block, those logic areas that have embedded memory blocks generally are arranged in the same column or columns of the array, so that the device has one or more columns of embedded memory blocks. This makes the embedded memory blocks, and more particularly their input/output and control registers, more suitable for chaining together in scan chains.

Most commonly, and advantageously for the present invention, the read/write control registers (including, typically, read address, write address, read enable and write enable registers) and the data input register (collectively the "input registers") for each embedded memory block are located on one side of the block, while the data output register is located on the other side of the block. Thus, there is a column of input registers and a column of output registers associated with each column of embedded memory blocks.

In accordance with the present invention, the column of input registers may be linked together as a scan chain by applying a voltage to a pin provided for that purpose, which controls a series of switching elements—e.g., multiplexers—between the various registers associated with a particular embedded memory block, and between the input registers of vertically adjacent embedded memory blocks. The output registers of vertically adjacent embedded memory blocks are also chained together, preferably by application of the same voltage, but alternatively by a voltage applied to a separate pin, to form an output scan chain. It is within the scope of the present invention to further chain together the various columns into longer scan chains, but preferably, to avoid the need for an excessive number of conductors in the device, the scan chains for individual columns are kept separate. More preferably, the chain for a particular column is constructed to include only those embedded memory blocks in that column that the user configuration actually uses. Because the user configuration is known when the metallization for connecting up the scan chains is laid out, the scan chain metallization can be designed to skip unused embedded memory blocks as necessary.

A pattern, or "vector," of input bits is devised that will fully exercise each embedded memory block in the device. For each embedded memory block, the vector includes data for the data input register, address information for the read address and write address registers, and appropriate values for the read enable and write enable registers so that data are read out to the data output register. The pattern of data expected in the data output register can be determined based on the vector inputted via the input registers, and the actual output data can be compared to the expected output data to determine whether or not the embedded memory block has functioned correctly.

After the vector for each embedded memory block has been generated, the vectors for all blocks are concatenated and clocked into the aforementioned input register scan chain through a pin provided for that purpose. After the concatenated vectors have been clocked completely into the input registers, the output data are clocked out of the output register scan chain and compared to the expected output data.

The embedded memory blocks within a single mask-programmable logic device are generally identical to one another. If that is the case, then it ordinarily will not be necessary to separately generate test vectors for each embedded memory block. Instead, one test vector can be generated and concatenated with itself as many times as there are blocks in a particular chain.

The testing just described is straightforward when all of the embedded memory blocks to be tested are identical. However, the user is permitted to configure the embedded memory blocks in various different ways, including rewritable configurations such as random access memory (synchronous or asynchronous) and content-addressable memory, and read-only configurations such as read-only memory and P-TERM logic. To facilitate testing in accordance with the present invention, circuitry preferably is provided that, on application of a voltage a pin provided for that purpose, temporarily reconfigures all embedded memory blocks to identical configuration. In a preferred embodiment, that configuration is a 128×16 memory array.

It should be noted that this temporary reconfiguration ordinarily will not render a read-only configuration writable. Therefore, if any of the embedded memory blocks are configured for the user as read-only memory or P-TERM logic, then even though those blocks can be reconfigured into, e.g., 128×16 arrays, they still cannot be written to. However, the same test vectors are nevertheless used for those blocks. During testing, the data input, write address and write enable registers will be ignored, but the read address and read enable registers will still cause data to be output from the block. The difference is that instead of the expected output data being based on the input data in the test vector, they are based on the user read-only configuration. The pattern of data expected to be output from that known configuration when addressed by the known read addressing in the test vector can be determined and compared to the portion of the output stream from the output scan chain that is attributable to the read-only block.

Ordinarily, a set of vectors, rather than a single vector, will be necessary to fully test each embedded memory block, because all locations within the block must be tested.

Preferably, a first chain of vectors is clocked in, and while the resulting output data are clocked out, the next chain of vectors is clocked in, until the embedded memory blocks in the column being tested have been fully "exercised" and tested.

In accordance with the present invention, the additional resources required on the mask-programmable logic device in order to accommodate testing include the switching elements (e.g., multiplexers) that chain the various registers, circuitry to put the device in test mode, a pin to activate that circuitry and interconnect conductors to connect up those other resources.

The test circuitry preferably generates a scan clock to clock the various registers in the scan chains. The test circuitry preferably also converts device input/output pins into pins for providing the scan data input and scan data output. Alternatively, one or more pins, beyond the test mode enable pin, could be dedicated to test mode functions.

The invention will now be described with reference to FIGS. 1–4.

As seen in FIG. 1, one preferred embodiment of a mask-programmable logic device 10 in accordance with the present invention includes an array of logic regions similar to those found in the APEX® family of programmable logic devices sold by Altera Corporation, of San Jose, Calif., the assignee hereof. In summary, those logic regions include, at the most basic level, "logic elements" (LEs) 11, which may be, for example, look-up table-based logic regions having four inputs and the ability to have registered or unregistered output. Logic elements 11 may be grouped into "logic array blocks" (LABs) 12. In the embodiment shown, each LAB 12 includes ten LEs 11, although other numbers of LEs 11 could be grouped into each LAB 12. The LABs may further be grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" or ESB) 14. Each GOL 13 preferably also includes a strip 15 of auxiliary gates, which may be used, e.g., for buffering of particular signals, such as high-fanout signals.

As shown, the GOLs 13 preferably are arranged in an orthogonal array, in rows and columns. Input/output elements preferably are located in regions 16 around the periphery of the array. Other auxiliary circuits, such as phase-locked loops for timing, etc., preferably are provided at convenient locations within the array, such as in region 17, shown in about the center of the array.

Figure 2:
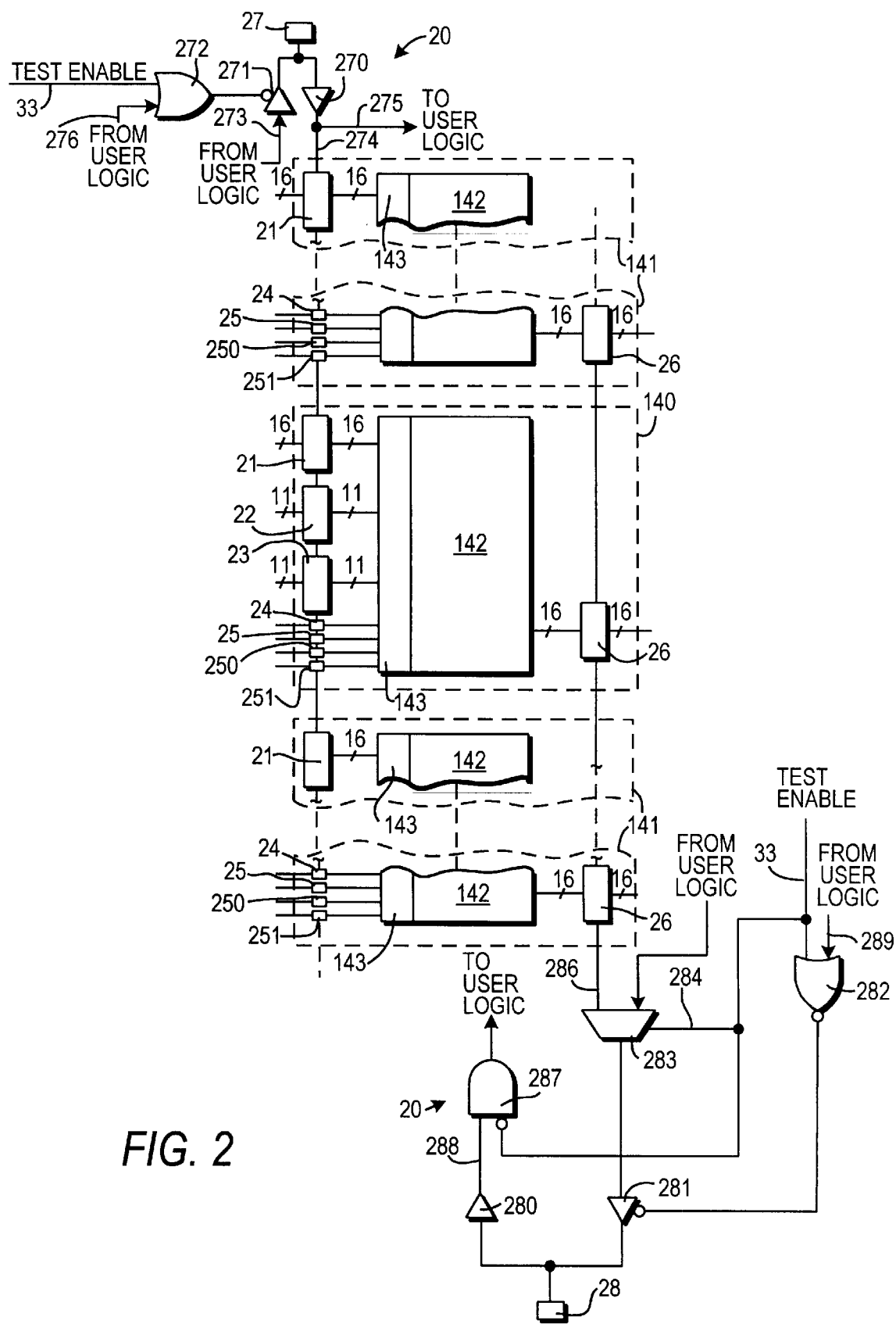
FIG. 2 is a partially fragmentary schematic representation of a column of embedded memory blocks in the device of FIG. 1.

FIG. 2 shows a column of embedded memory blocks associated with one column of GOLs 13, including the appurtenant registers, showing how the registers are connected for the purposes of the present invention.

FIG. 2 shows one complete embedded memory block 140 as well as a number of partial blocks 141 above and below block 140, extending to I/O regions 20. As can be seen, each embedded memory block 140, 141 includes a memory array 142, address decode logic 143 and several registers. The registers include data input register 21, as well as read/write control registers preferably including a read address register 22, a write address register 23, a read enable register 24, a write enable register 25, a read cascade register 250 and a write cascade register 251. Each embedded memory block 140, 141 also has an output data register 26. Preferably, as shown, output data register 26 is on a different side of embedded memory block 140, 141 from input data register 21 and the read/write control registers, so that, for a particular column of embedded memory blocks 140, 141, separate scan chains of (1) the input data registers 21 and the read/write control registers 22–25, 250, 251, and (2) the output data registers 26, can be more easily formed.

Figure 3:
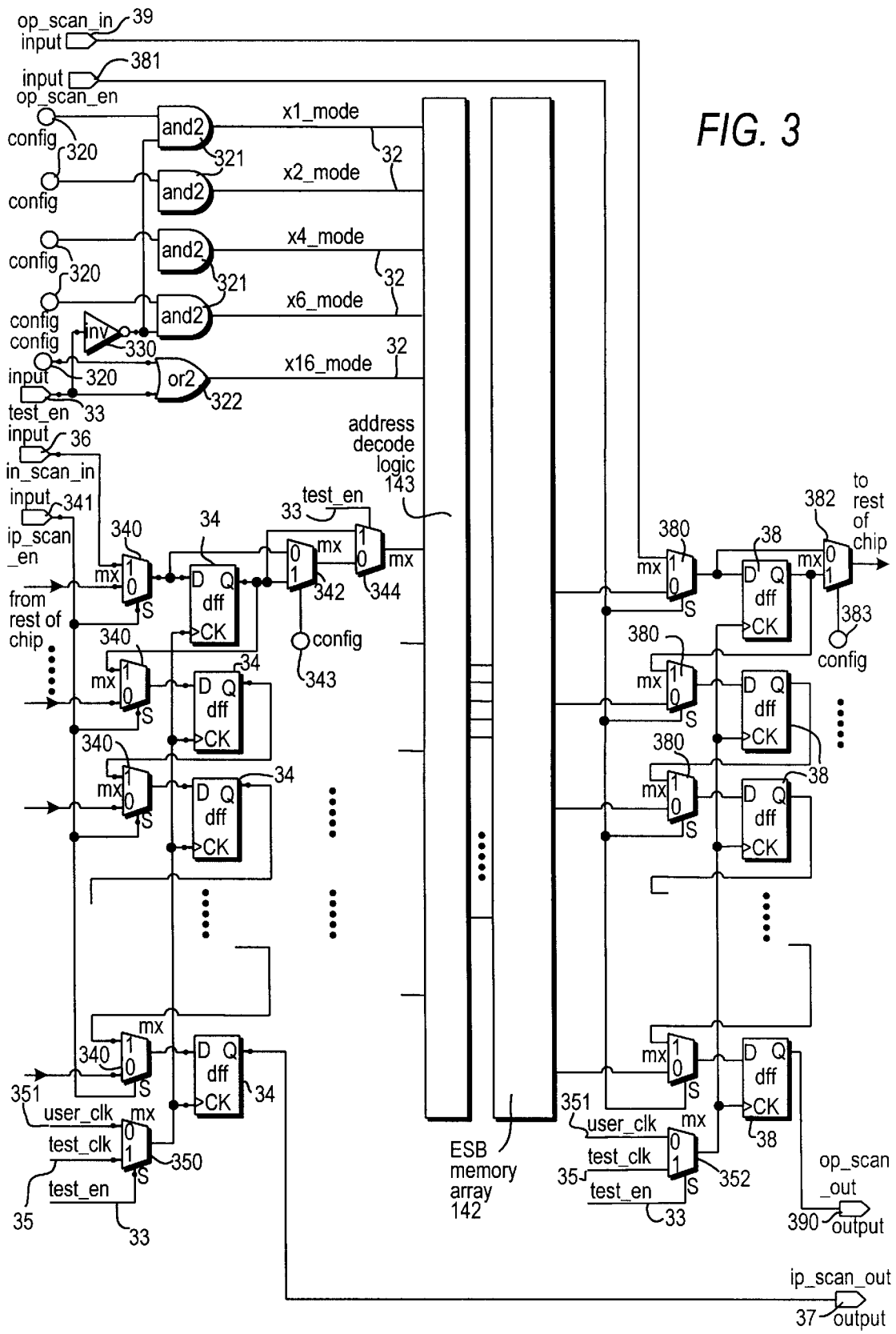
FIG. 3 is a schematic representation of the interior of an embedded memory block in the device of FIGS. 1 and 2, showing the test circuitry thereof.

It should be noted that in the embodiment shown in FIG. 3, all of the reconfiguration required for testing, including setting up of the scan chains and reconfiguring of memory arrays 142, is achieved by applying voltage to a single test enable pin. However, there may be other embodiments (not shown), still within the scope of the present invention, in which more than one pin is required. For example, there could be one pin for connecting up the scan chains (or a separate pin for connecting up each of the input and output scan chains) and one pin for reconfiguring the memory arrays.

Moreover, in the embodiment shown, the test enable pin even reconfigures various other I/O pins to be used for test I/O. As above, there could be other embodiments (not shown), still within the scope of the present invention, in which there are dedicated pins for test I/O in addition to the dedicated test enable pin.

In the embodiment shown in FIG. 3, each embedded memory block 140, 141 includes a memory array 142 and address decode logic 143, and preferably has five mode selection inputs 32 that allow the user to configure memory 142 in one of five data widths (x1, x2, x4, x8 and x16). Thus, in a preferred embodiment in which memory array 142 has a capacity of two kilobits, memory array 142 can be configured as a 2048×1 memory, a 1024×2 memory, a 512×4 memory, a 256×8 memory or a 128×16 memory by programming the appropriate one of configuration bits 320. Insofar as device 10 is a mask-programmable device, the programming of one of configuration bits 320 is accomplished by providing metallization that closes an appropriate contact (not shown).

Interposed between the respective configuration bits 320 and the selection inputs 32 for the x1, x2, x4 and x8 modes is a respective two-input AND gate 321. The first input to each of AND gates 321 is the respective configuration bit 320. The second input to each of AND gates 321 is test enable signal 33 (input on a single pin, not shown, of device 10), inverted by inverter 330. Interposed between the configuration bit 320 and the configuration input 32 for the x16 mode is a two-input OR gate 322, whose second input is the uninverted test enable signal 33.

It is clear from the foregoing description that if test enable signal 33 is not asserted—i.e., is low—then configuration bits 320 control which width mode is selected. It is equally clear that if test enable signal 33 is asserted—i.e., is high—then the x16 mode is selected regardless of the states of configuration bits 320. Thus, in the preferred embodiment in which memory array 142 is a two-kilobit array, in test mode it is configured as a 128×16 array. Note that any of the possible modes could be chosen for the test mode, as long as the mode is known so that the expected performance of memory array 142 can be determined regardless of user configuration. However, choosing the x16 mode minimize the number of addresses to be accessed for testing purposes to, in this case, 128 addresses.

FIG. 3 also shows how input-side registers 21–25, 250, 251 can be connected into a scan chain. Each respective one of registers 21–25, 250, 251 preferably is actually a respective number of single-bit registers 34 corresponding to the number of bits in the respective register 21–25, 250, 251. Registers 34 are chained output-to-input through input-select multiplexers 340. Each multiplexer 340 selects between an on-chip signal in user mode and the scan chain in test mode, under the control of input scan enable signal 341. Note that input scan enable signal 341 can be applied on an external pin (not shown), or derived on-chip from test enable signal 33. The former requires a separate pin for every scan chain if the user is to have control over when the scan enable signal is applied to different scan chains, but if all scan chains are to be enabled at once, then one pin can be provided. An intermediate number of pins can be provided so that groups of chains can be input-scan-enabled. Even if the input scan enable signal is derived on-chip from the test enable signal, one or more pins may be provided to allow the user to determine which scan chains will be enabled by an on-chip-derived signal. Such pin or pins may be dedicated pins for that purpose, or may have other functions in user mode as described in more detail below.

In normal operation, a respective input register multiplexer 342 (only one shown) for each register 34 selects between registered and unregistered inputs under the control of configuration bit 343. However in test mode, under the control of test enable signal 33, a respective test input multiplexer 344 (only one shown) overrides multiplexer 342, always selecting the respective registered input.

The scan data are clocked through the scan chain of registers 34 under the control of test clock 35 selected under the control of test enable signal 33 by input clock select multiplexer 350, which in user mode selects user clock 351.

The input scan data are input at 36. If the current embedded block 140, 141 is the first in a column, then 36 represents an external pin, which may be dedicated to that function, or which may have another function in user mode as described in more detail below. If the current embedded block 140, 141 is not the first in a column, then 36 represents the chain from the previous embedded block. The input scan data are output at 37. If the current embedded block 140, 141 is not the last in a column, then 37 represents the chain to the next embedded block. If the current embedded block 140, 141 is the last in a column, then there is no need for any output 37 from that block. However, it may be desirable for other testing purposes, or for user purposes, to connect output 37 of the last block in a column to an external pin.

On the output side, output register 26 preferably is actually a respective number of single-bit registers 38 corresponding to the number of bits in register 26. Registers 38 are chained output-to-input through output-select multiplexers 380. Each multiplexer 380 selects between an output from array 142 in user mode and during test mode except when the output chain is being scanned out, or the previous chain output when the output chain is being scanned out during test mode, under the control of output scan enable signal 381. For use only in normal operation, a respective output register multiplexer 382 (only one shown) for each register 38 selects between registered and unregistered outputs under the control of configuration bit 383.

Note that output scan enable signal 381 can be applied on an external pin (not shown), or derived on-chip from test logic (not shown). If output scan enable signal is applied externally, it may be applied to one pin, and used for all output scan chains, or individual pins may be used to apply output scan enable signals to different scan chains. Alternatively, an intermediate number of pins can be provided so that groups of chains can be output-scan-enabled. Even if the output scan enable signal is derived on-chip from the test enable signal, one or more pins may be provided to allow the user to determine which scan chains will be enabled by an on-chip-derived signal. Such pin or pins may be dedicated pins for that purpose, or may have other functions in user mode as described in more detail below.

The scan data are clocked through the scan chain of registers 38 under the control of test clock 35 selected under the control of test enable signal 33 by output clock select multiplexer 352, which in user mode selects user clock 351.

The output scan data are input at 39. If the current embedded block 140, 141 is the first in a column, then there need not be an input 39. However, it may be desirable for other testing purposes, or for user purposes, to connect input 39 of the first block in a column to an external pin. If the current embedded block 140, 141 is not the first in a column, then 39 represents the chain from the previous embedded block. The output scan data are output at 390. If the current embedded block 140, 141 is the last in a column, then 390 represents an external pin, which may be dedicated to that function, or which may have another function in user mode as described in more detail below. If the current embedded block 140, 141 is not the last in a column, then 390 represents the chain to the next embedded block.

As mentioned several times above, external pins used in test mode may be dedicated to that purpose, or may have other uses in user mode. FIG. 2 shows an external pin 27 that can be configured as a test mode input and an external pin 28 that can be configured as a test mode output.

Pin 27 has an input buffer 270 and an output buffer 271 controlled by the output of a two-input OR-gate 272. When output buffer 271 is turned on, a user output signal 273 can be conducted to pin 27. However, when the test enable signal 33, which is input to OR-gate 272, is high, the output of OR-gate 272 is high, turning off output buffer 271. Input buffer 270 remains on, allowing test inputs to be conducted to the test logic on conductor 274. Conductor 275 conducts those inputs to user logic, but the user logic is not active. Note that in user mode, the user can program a signal on input 276 of OR-gate 272 to turn off buffer-271 when pin 27 is to be a user input.

Pin 28 has an input buffer 280 and an output buffer 281 controlled by the output of a two-input NOR-gate 282. When output buffer 281 is turned on, a signal from output multiplexer 283 can be conducted to pin 28. Multiplexer 283 selects a user logic output 284 unless test enable signal 33 causes multiplexer 283 to select test logic output 286. At the same time, the test enable signal 33, which also is input to NOR-gate 282, is high, causing the output of NOR-gate 282 to go low, turning on output buffer 281. Input buffer 280 remains on, but any signal passing through buffer 280 is ANDed at AND-gate 287 with the inverse of test enable signal 33, turning off any input 288. Note that in user mode, the user can program a signal on input 289 of NOR-gate 282 to turn on buffer 281 when pin 28 is to be a user output. If pin 28 is an input in user mode, AND-gate 287 functions as an buffer for the input.

Once the scan chains, the embedded memory blocks and the I/O pins have been configured for test mode, the testing process can begin. This involves clocking one or more test vectors in through the input-side scan chain (i.e., the scan chain including input data register 21 and read/write control registers 22–25, 250, 251), and allowing as many clock cycles are required, as discussed below, for the data to move through embedded memory blocks 140, 141, clocking data out through the output-side scan chain of output data registers 26, and comparing the data from the output-side scan chain to the data expected based on the test vector input to the input-side scan chain. Normally, the first test vector will be clocked in in one more cycle than the number of registers in the input-side scan chain, with the "extra" cycle being used for parallel loading of the register contents into address decode logic 143 and memory array 142. For the next test vector, that same number of cycles will be used, and during those cycles, the contents of the output scan chain resulting from the first test vector will be clocked out as well. Because the output scan chain is ordinarily shorter than the input scan chain, the input scan chain length ordinarily controls the number of cycles required. This will continue until the last test vector has been clocked in, and then a number of cycles equal to the number of registers in the output scan chain will be needed to clock out the last set of test outputs.

As shown in FIG. 2, the input-side scan chain preferably includes forty-two registers for each embedded memory block 140, 141. In a typical embodiment, there may be twenty-six embedded memory blocks in a column of device 10. Each test vector in such an embodiment would be 42×26=1,092 bits long. Each vector is therefore clocked in over 1,092 scan clock cycles. After the 1,092nd cycle, input scan enable signal 341 is deasserted, the write-enable signal for each embedded memory block 140, 141 is then asserted, and then the read enable is asserted so that data are read out based on the read address clocked in as part of the test vector. Over a portion of the next 1,092 cycles, as signal 341 is again asserted and the next test vector is clocked in, the output vector is clocked out of the output-side scan chain. If there are twenty-six embedded memory blocks 140, 141 and each output data register 26 is sixteen bits wide, then output vector will have been fully clocked out after 416 cycles, and can then be compared to the expected data. This can be repeated with as many test vectors as are necessary to fully "exercise" the embedded memory blocks 140, 141.

Although in the example given and discussed above each test vector is 1,092 bits long, it is not necessary to construct that many bits for each test vector. Because preferably all embedded memory blocks 140, 141 in a given device 10 are identical, a test vector of suitable length for one embedded memory block (forty-two bits in this example) can be constructed, and then the appropriate number of copies of that vector can be concatenated to form the full test vector. This does not prevent a user from providing a test vector with different portions for different ones of the embedded memory blocks, if desired for some reason. Similarly, there may be mask-programmable logic devices in which more than one type of embedded memory block is included. In such a case, the user could prepare test vector portions for each type of embedded memory block, concatenating the appropriate numbers of each type of vector portion into the full test vector. In any case, each column of embedded memory blocks 140, 141 ordinarily is tested with a plurality of test vectors in order to fully exercise and test each embedded memory block 140, 141.

The configuration of one or more of embedded memory blocks 140, 141 as a read-only device (e.g., ROM memory or P-TERM logic) does not affect the generation of the test vectors. The same test vector is prepared for such an embedded memory block 140, 141 as is prepared for any other embedded memory block 140, 141 of the same size. Although the write address and input data will be ignored, there is no reason not to use the same read address as for a rewritable one of blocks 140, 141, as long as one knows to expect, when reviewing the output scan data, that the data outputted based on the inputted read address will be based on the fixed memory configuration (which is known) of that particular block 140, 141, and not on the input data in the test vector.

It will be understood that while the testing hardware is at least partially present in a mask-programmable logic device according to the invention even before it is programmed, as well as after programming, the method according to the invention generally cannot be carried out until the device is programmed by application of the metallization layers defined by the end user.

Figure 4:
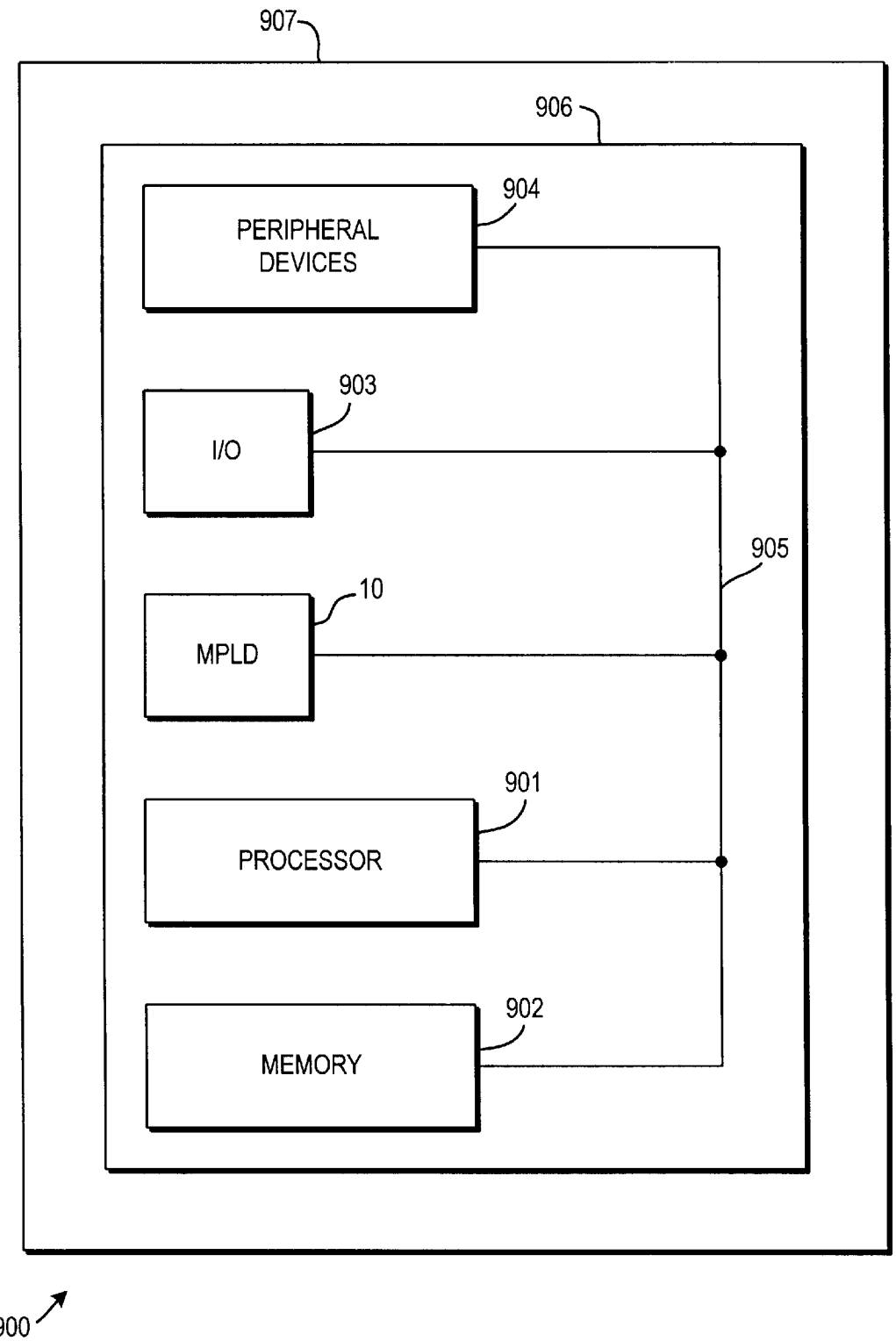
FIG. 4 is a simplified block diagram of an illustrative system employing a programmable logic device in accordance with the invention.

Mask-programmable logic device 10 as described above may be used as part of a data processing system 900 shown in FIG. 4. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using mask-programmable logic is desirable. Mask-programmable logic device 10 can be used to perform a variety of different logic functions. For example, mask-programmable logic device 10 can be configured as a processor or controller that works in cooperation with processor 901. Mask-programmable logic device 10 may also be used as an arbiter for arbitrating access to a shared resources in system 900. In yet another example, mask-programmable logic device 10 can be configured as an interface between processor 901 and one of the other components in system 900. It should be noted that system 900 is only exemplary, and that the true scope and spirit of the invention should be indicated by the following claims.

Various technologies can be used to implement mask-programmable logic devices 10 as described above according to this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A mask-programmable logic device comprising:
   an array of mask-programmable logic areas;
   a plurality of embedded memory blocks, each of said embedded memory blocks being associated with one of said mask-programmable logic areas, each of said embedded memory blocks having a set of read/write control registers, write data registers and data output registers associated therewith; and
   memory testing circuitry comprising:
   first switching elements for chaining together at least some of said read/write control registers and said write data registers;
   second switching elements for chaining together at least some of said data output registers; and
   a test scan clock for clocking data through said chains of read/write control registers and write data registers, and said chains of output registers.

2. The mask-programmable logic device of claim 1 wherein said first and second switching elements comprise multiplexers.

3. The mask-programmable logic device of claim 1 wherein said memory testing circuit further comprises a test enable circuit that configures said embedded memory block for testing.

4. The mask-programmable logic device of claim 1 wherein said first switching elements chain together all of said read/write control registers and said write data registers for any one of said embedded memory blocks for which any of said read/write control registers and said write data registers are chained.

5. The mask-programmable logic device of claim 4 wherein said second switching elements chain together said data output registers for all embedded memory blocks for which any of said read/write control registers and said write data registers are chained.

6. The mask-programmable logic device of claim 4 wherein:
said array is arranged in rows and columns; and
said first switching elements chain together all of said read/write control registers and said write data registers for all embedded memory blocks in a column of said array.

7. The mask-programmable logic device of claim 6 wherein said second switching elements chain together all of said data output registers for all said embedded memory blocks in said column of said array.

8. The mask-programmable logic device of claim 1 wherein:
said array is arranged in rows and columns; and
said first switching elements chain together all of said read/write control registers and said write data registers for all embedded memory blocks in a column of said array.

9. The mask-programmable logic device of claim 8 wherein said second switching elements chain together all of said data output registers for all said embedded memory blocks in said column of said array.

10. The mask-programmable logic device of claim 1 wherein:
said array is arranged in rows and columns; and
said second switching elements chain together all of said data output registers for all said embedded memory blocks in a column of said array.

11. A digital processing system comprising:
processing circuitry;
a memory coupled to said processing circuitry; and
a programmable logic system as defined in claim 1 coupled to the processing circuitry and the memory.

12. A printed circuit board on which is mounted a programmable logic system as defined in claim 1.

13. The printed circuit board defined in claim 12 further comprising:
memory circuitry mounted on the printed circuit board and coupled to the programmable logic system.

14. The printed circuit board defined in claim 13 further comprising:
processing circuitry mounted on the printed circuit board and coupled to the memory circuitry.

15. A method of testing a mask-programmable logic device, said mask-programmable logic device having:
an array of mask-programmable logic areas, and
a plurality of embedded memory blocks, each of said embedded memory blocks being associated with one of said mask-programmable logic areas, each of said embedded memory blocks having a set of read/write control registers, write data registers and data output registers associated therewith, said method comprising:
chaining together at least some of said read/write control registers and said write data registers;
chaining together at least some of said data output registers;
clocking data through said chain of read/write control registers and write data registers, and said chain of output registers; and
comparing data clocked out of said chain of output registers to data expected to be clocked out of said chain of output registers as a result of said clocking of data through said chain of read/write control registers and write data registers, and said chain of output registers.

16. The method of claim 15 further comprising configuring said embedded memory block for testing.

17. The method of claim 15 wherein said chaining together at least some of said read/write control registers and said write data registers comprises chaining together all of said read/write control registers and write data registers for any one of said embedded memory blocks for which any of said read/write control registers and said write data registers are chained.

18. The method of claim 17 wherein said chaining together at least some of said data output registers comprises chaining together said data output registers for all embedded memory blocks for which any of said read/write control registers and said write data registers are chained.

19. The method of claim 17 wherein, when said array of mask-programmable logic areas is arranged in rows and columns:
said chaining together at least some of said read/write control registers and said write data registers comprises chaining together all of said read/write control registers and said write data registers for all embedded memory blocks in a column of said array; and
said chaining together at least some of said data output registers comprises chaining together said data output registers for all embedded memory blocks in said column of said array.

\* \* \* \* \*